United States Patent
Huang

(10) Patent No.: US 9,613,985 B1
(45) Date of Patent: Apr. 4, 2017

(54) PIXEL STRUCTURE AND FORMING METHOD THEREOF

(71) Applicant: CHUNGHWA PICTURE TUBES, LTD., Taoyuan (TW)

(72) Inventor: Jiun-Jr Huang, Yilan County (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 0 days.

(21) Appl. No.: 15/080,553

(22) Filed: Mar. 24, 2016

(30) Foreign Application Priority Data

Jan. 13, 2016 (CN) .......................... 2016 1 0021196

(51) Int. Cl.
*H01L 27/12* (2006.01)
(52) U.S. Cl.
CPC ...... *H01L 27/1237* (2013.01); *H01L 27/1288* (2013.01)
(58) Field of Classification Search
CPC ......... G02F 1/133553; G02F 1/133555; G02F 1/136227; H01L 27/1237; H01L 27/124
See application file for complete search history.

(56) References Cited

U.S. PATENT DOCUMENTS

| 2002/0041354 | A1 | 4/2002 | Noh et al. |
| 2003/0117558 | A1 | 6/2003 | Kim et al. |
| 2005/0068483 | A1 | 3/2005 | Lee et al. |
| 2005/0179846 | A1 | 8/2005 | Lee et al. |
| 2009/0141224 | A1 | 6/2009 | Ito et al. |
| 2009/0256152 | A1* | 10/2009 | Chien ............... G02F 1/136227 257/59 |
| 2009/0302318 | A1* | 12/2009 | Chang ................... G02F 1/1333 257/59 |
| 2013/0154912 | A1* | 6/2013 | Nagami ............... G09G 3/3648 345/92 |

FOREIGN PATENT DOCUMENTS

| TW | M391115 U1 | 10/2010 |
| TW | 201310147 A | 3/2013 |

* cited by examiner

*Primary Examiner* — Matthew Landau
*Assistant Examiner* — Scott Stowe
(74) *Attorney, Agent, or Firm* — CKC & Partners Co., Ltd.

(57) ABSTRACT

The instant invention provides a pixel structure. The pixel structure includes a substrate, a gate electrode, a gate insulating layer, a source electrode, a drain electrode, a plurality of metallic optical structures, a pixel electrode, and a common electrode. The gate electrode is disposed on the substrate. The gate insulating layer is on the gate electrode. The source electrode and the drain electrode are disposed on the gate insulating layer. The plurality of metallic optical structures are embedded in the gate insulating layer. The pixel electrode electrically connects the drain electrode and is disposed on the plurality of metallic optical structures. The common electrode is disposed under the plurality of metallic optical structures.

11 Claims, 10 Drawing Sheets

PIXEL STRUCTURE AND FORMING METHOD THEREOF

RELATED APPLICATIONS

This application claims priority to Chinese Application Serial Number 201610021196.1, filed Jan. 13, 2016, which is herein incorporated by reference.

BACKGROUND

Field of Invention

The present invention relates to a pixel structure and a forming method thereof. More particularly, the present invention relates to a pixel structure which has a gate insulating layer embedded with a metallic optical structure and a forming method thereof.

Description of Related Art

A liquid crystal display has extensive applicability because it has some advantages, such as light weight, small volume, and low energy consumption. Traditionally, a pixel electrode in a pixel structure of a fringe field switching (FFS) liquid crystal display (LCD) usually includes strip electrodes to improve a color shift problem. However, directions of power lines near a central region and an edge region of the strip electrodes are different from other regions. Accordingly, light cannot pass easily and black lines thus exist in the panel, such that the brightness and contrast ratio of the FFS LCD are reduced. The black line is also called disclination line. When observing the FFS LCD, black lines usually appear on the strip electrodes and on a silt between the two adjacent strip electrodes. Accordingly, an improvement for components in FFS LCD and a novel method of forming the components are required.

SUMMARY

An object of the instant disclosure is to provide a pixel structure and a forming method thereof. The brightness and the contrast ratio of a liquid crystal display can be enhanced and optimized by easily adjusting the structure of metallic optical structure.

The instant disclosure provides a pixel structure. The pixel structure includes a substrate, a gate electrode, a gate insulating layer, a source electrode, a drain electrode, a plurality of metallic optical structures, a pixel electrode, and a common electrode. The gate electrode is disposed on the substrate. The gate insulating layer is on the gate electrode. The source electrode and the drain electrode are disposed on the gate insulating layer. The plurality of metallic optical structures are embedded in the gate insulating layer. The pixel electrode electrically connects the drain electrode and is disposed on the plurality of metallic optical structures. The common electrode is disposed under the plurality of metallic optical structures.

In one embodiment of the instant disclosure, the gate insulating layer has a plurality of trenches and each metallic optical structure is disposed in one of the plurality of trenches.

In one embodiment of the instant disclosure, the plurality of metallic optical structures fill the plurality of trenches of the gate insulating layer.

In one embodiment of the instant disclosure, each metallic optical structure covers an inner surface of each trench of the gate insulating layer but does not fill each trench to form a notch on each metallic optical structure.

In one embodiment of the instant disclosure, cross-sections of the plurality of trenches are in the shape of an inverted trapezoid, a step, a semi-ellipse, or a combination thereof.

In one embodiment of the instant disclosure, a material of the source electrode and a material of the drain electrode are the same as a material of the plurality of metallic optical structures.

In one embodiment of the instant disclosure, the pixel electrode includes a plurality of strip electrodes, a slit is between the two adjacent strip electrodes, and the plurality of metallic optical structures and the plurality of strip electrodes are arranged in parallel.

In one embodiment of the instant disclosure, the plurality of metallic optical structures include at least one first metallic optical structure and at least one second metallic optical structure, the first metallic optical structure overlaps one of the plurality of strip electrodes in a direction perpendicular to the substrate, and the second metallic optical structure overlaps one of the slits in the direction perpendicular to the substrate.

In one embodiment of the instant disclosure, the pixel structure further includes an active layer which is on the gate insulating layer and below the source electrode and the drain electrode.

The instant disclosure provides a method of forming a pixel structure. The method includes the following steps. A gate electrode and a common electrode are formed on a substrate. A gate insulating layer is formed on the gate electrode. The gate insulating layer is patterned to form a plurality of trenches. A source electrode, a drain electrode, and a plurality of metallic optical structures are formed, wherein each metallic optical structure is disposed in one of the plurality trenches, the source electrode and the drain electrode are on the gate insulating layer. A pixel electrode is formed on the plurality of metallic optical structures.

In one embodiment of the instant disclosure, the gate insulating layer is patterned by a gray scale mask.

In one embodiment of the instant disclosure, the method further includes forming an active layer on the gate insulating layer, before forming the source electrode, the drain electrode, and the plurality of metallic optical structures.

Compared to the existing techniques, instant disclosure has the following advantages. In the pixel structure and the forming method thereof of the instant disclosure, the metallic optical structure is capable of scattering light achieving the pixel structure. Therefore, when the pixel structure is disposed in liquid crystal display, the metallic optical structure can effectively increase backlight utilization efficiency, thereby enhancing brightness of the liquid crystal display.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

In order to solve the black line problem in liquid crystal display, the instant disclosure provides a pixel structure and a forming method thereof. When a gate insulating layer is embedded with a metallic optical structure, which is capable of scattering light achieving the pixel structure. Therefore, when the pixel structure is disposed in liquid crystal display, the metallic optical structure can effectively increase backlight utilization efficiency, thereby enhancing brightness of the liquid crystal display.

Figure 1:
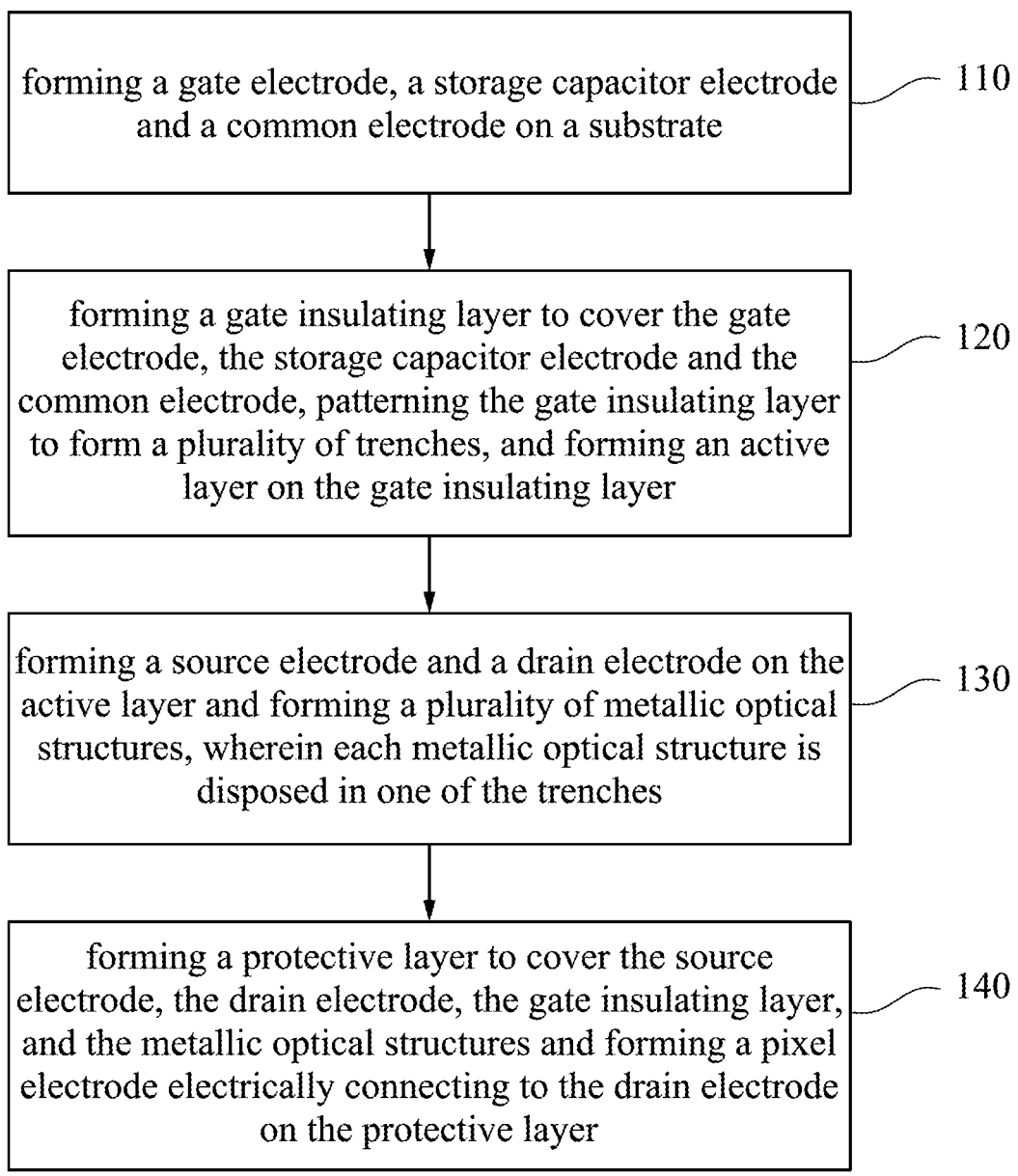
FIG. 1 shows a flow chart of a method of forming a pixel structure, in accordance with one embodiment of the instant disclosure.

The instant disclosure provides a method of forming a pixel structure. Referring to FIG. 1 and FIGS. 2A-2D at the same time. FIG. 1 shows a method 100 of forming a pixel structure, in accordance with one embodiment of the instant disclosure. The method 100 includes an operation 110, an operation 120, an operation 130, and an operation 140. FIGS. 2A-2D are cross-sectional views of a pixel structure 200 at various stages of fabrication, in accordance with one embodiment of the instant disclosure. Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 2A:
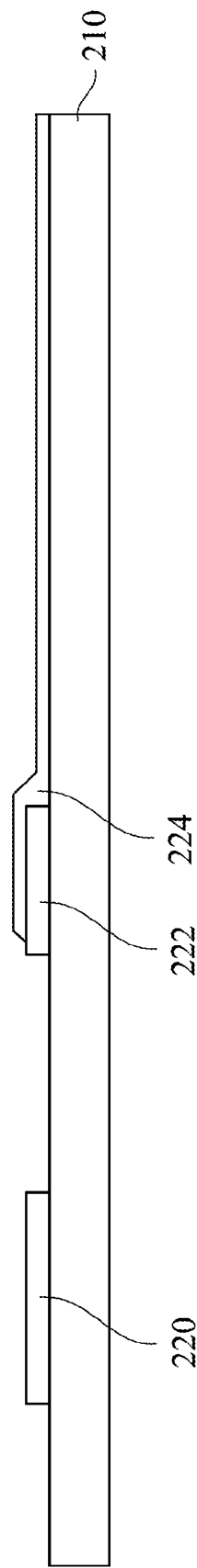
FIGS. 2A-2D are cross-sectional views of a pixel structure at various stages of fabrication, in accordance with one embodiment of the instant disclosure.

In operation 110, a gate electrode 220, a storage capacitor electrode 222, and a common electrode 224 are formed on a substrate 210 as shown in FIG. 2A. The storage capacitor electrode 222 electrically connects the common electrode 224.

Figure 2B:
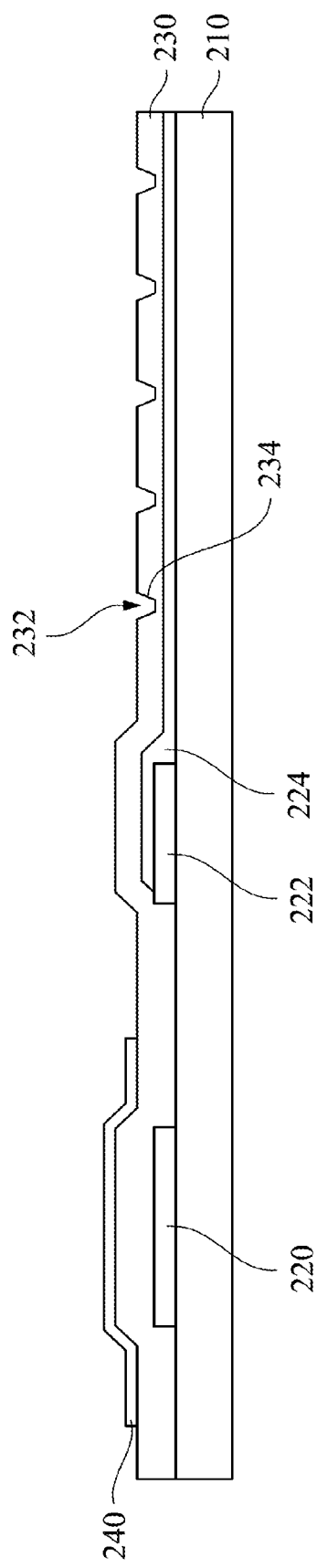

In operation 120, a gate insulating layer 230 is formed to cover the gate electrode 220, the storage capacitor electrode 222, and the common electrode 224 as shown in FIG. 2B. The gate insulating layer 230 is patterned to form trenches 232. Moreover, an active layer 240 is formed on the gate insulating layer 230. More specifically, the trenches 232 are on the common electrode 224 and the inner surfaces 234 are exposed. The active layer 240 is on the gate electrode 220. In one embodiment, the gate insulating layer 230 is patterned by a gray scale mask to form the trenches 232. It is worth noting that, in traditional fabrication techniques, patterning a gate insulating layer by a mask is necessary for forming a pixel structure. The instant disclosure replaces the mask in the traditional fabrication techniques with the gray scale mask. Therefore, patterning step of the gate insulating layer 230 can be performed, which is required in the traditional fabrication techniques, and the trenches 232 are formed at the same time. Accordingly, the step of forming the trenches 232 can be integrated into the steps of the traditional fabrication technique without adding the number of masks necessary in the traditional fabrication techniques.

Figure 2C:
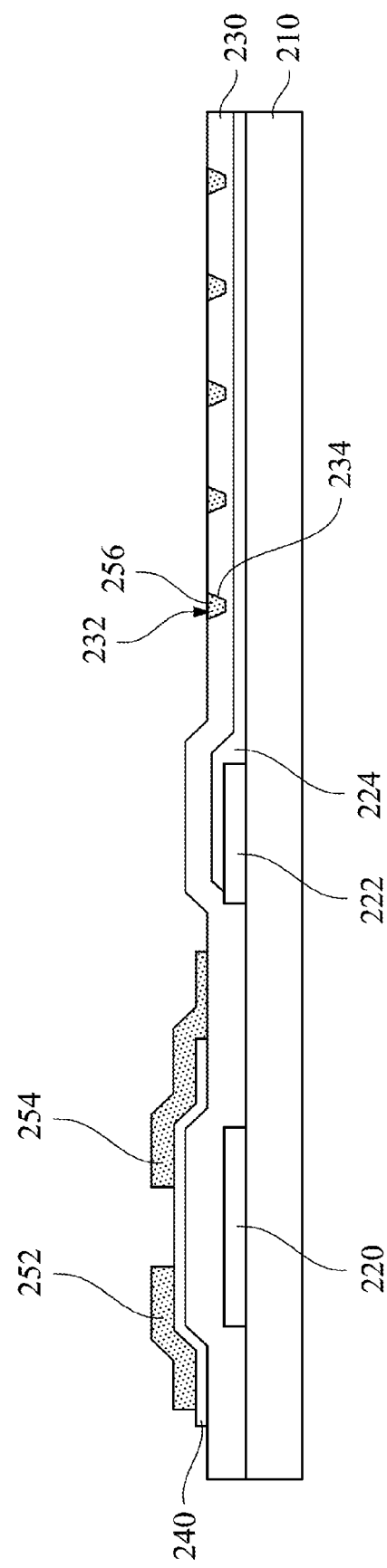

In operation 130, a source electrode 252 and a drain electrode 254 are formed on the active layer 240 and a plurality of metallic optical structures 256 are formed as shown in FIG. 2C. Each metallic optical structure 256 is in one of the trenches 232. In one embodiment, the source electrode 252, the drain electrode 254, and the metallic optical structures 256 are formed at the same time. Therefore, a material of the source electrode 252 and a material of the drain electrode 254 are the same as a material of the metallic optical structures 256. Because the step of forming the metallic optical structures 256 can be integrated into the step of forming a source electrode and a drain electrode in the traditional fabrication techniques, the step of forming the metallic optical structures 256 does not complicate existing methods of forming a pixel structure.

In operation 140, a protective layer 260 is formed to cover the source electrode 252, the drain electrode 254, the gate insulating layer 230, and metallic optical structures 256. Moreover, a pixel electrode 270 is formed on the protective layer 260 and electrically connects the drain electrode 254. Because the protective layer 260 is patterned, the drain electrode 254 can be exposed and is in direct contact with the pixel electrode 270 accordingly. By performing the above operations 110-140, the pixel structure 200 is formed. In one embodiment, a material of the pixel electrode 270 is indium tin oxide (ITO).

Figure 2D:
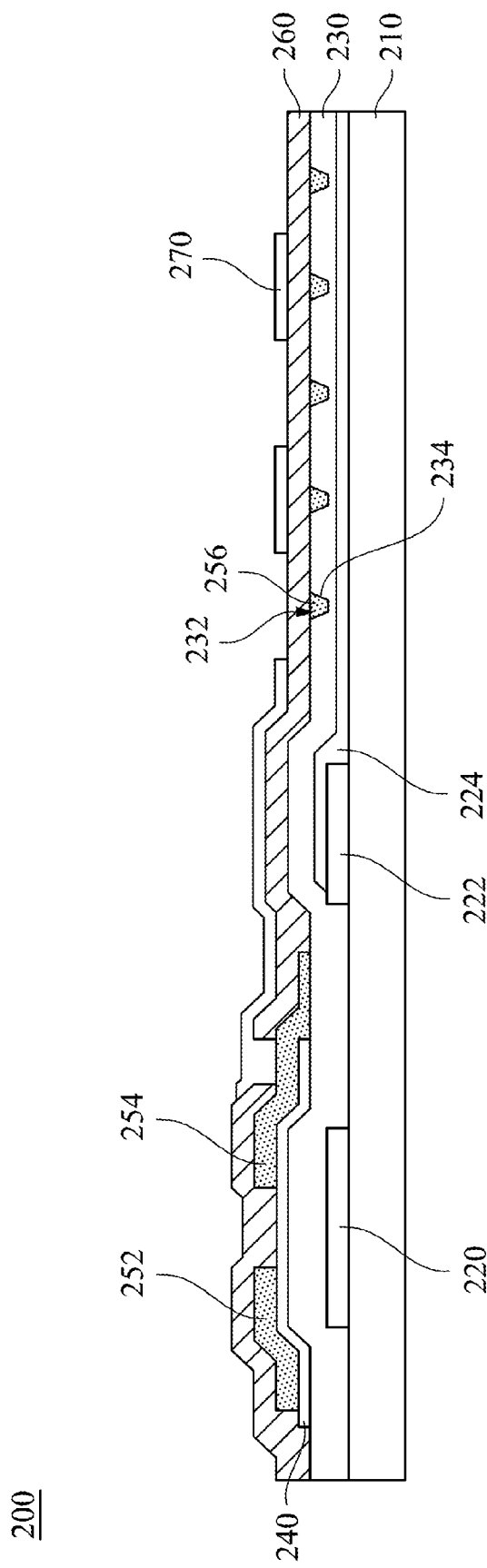

Referring to FIG. 2D, the gate electrode 220, the storage capacitor electrode 222, and the common electrode 224 are disposed on the substrate 210 in the pixel structure 200. The gate insulating layer 230 is on the gate electrode 220, the storage capacitor electrode 222, and the common electrode 224. The metallic optical structures 256 are embedded in the gate insulating layer 230. The active layer 240 is disposed on the gate insulating layer 230. The source electrode 252 and the drain electrode 254 are disposed on the active layer 240. The gate electrode 220, the active layer 240, the source electrode 252, and the drain electrode 254 form a thin-film transistor. The protective layer 260 is on the source electrode 252, the drain electrode 254, the gate insulating layer 230, and the metallic optical structures 256. The pixel electrode 270 is on the protective layer 260 and electrically connects the drain electrode 254. The common electrode 224 is under the metallic optical structures 256. It is worth noting that the metallic optical structures 256 are between the common electrode 224 and the pixel electrode 270.

When the pixel structure 200 is disposed in a liquid crystal display, an arrangement of liquid crystal molecules can be controlled by the thin-film transistor, the common electrode 224, and the pixel electrode 270 to adjust transmittance of light. When the light achieves the gate insulating layer 230, the light can be scattered by the metallic optical structures 256. Therefore, the black line problem can be improved, backlight utilization efficiency is effectively increased, and the brightness of the liquid crystal display is enhanced. In one embodiment, the pixel structure 200 of instant disclosure is a pixel unit of a pixel array substrate. The pixel array substrate includes data lines, scan lines, and the pixel structure 200. The data lines intersect insulatively with scan lines to define pixel regions. The thin-film transistor, which consists of the gate electrode 220, the active layer 240, the source electrode 252, and the drain electrode 254, is disposed on an intersection of the data line and the scan line. The gate electrode 220 electrically connects the scan line, the source electrode 252 electrically connects the data line, and the drain electrode electrically connects the pixel electrode 270. The common electrode 224, the metallic optical structures 256, and the pixel electrode 270 are disposed in the pixel region.

In one embodiment, a material of the metallic optical structures 256 is Mo, Al, Ti, Ta, Cu, Sn, Ni, Au, Ag, W, Cr, Pt, alloy, or a combination thereof. In one embodiment, the metallic optical structures 256 are a single-layer metal or a laminated metal.

As shown in FIG. 2D, the gate insulating layer 230 has trenches 232. Each metallic optical structure 256 is in one of the trenches 232. These metallic optical structures 256 fill the trenches 232 of the gate insulating layer 230 and fully cover inner surfaces 234 of the trenches 232. Cross-sections of the trenches 232, which is shown in FIG. 2D, are in the shape of an inverted-trapezoid without limits, because every metallic optical structures formed in arbitrary shaped trenches is capable of scattering light.

Figure 3C:
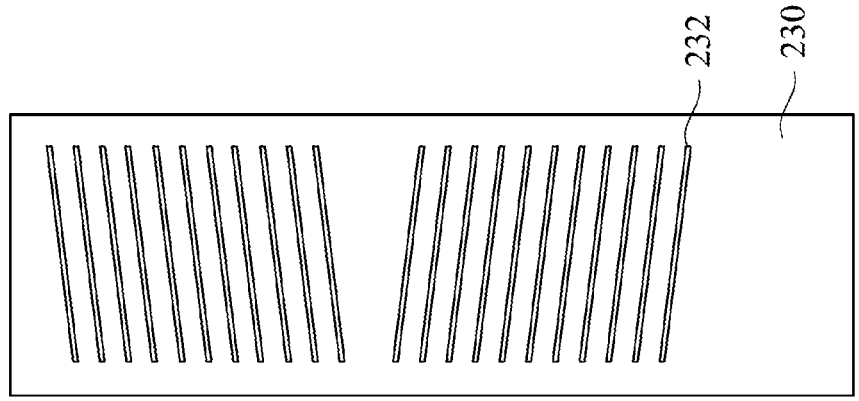
FIG. 3C shows a plan view of a gate insulating layer in FIG. 2D.
Figure 3B:
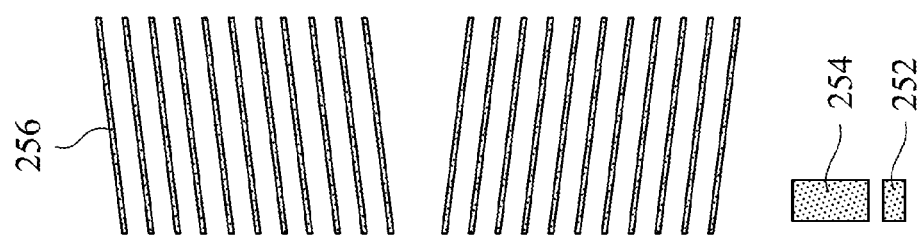
FIG. 3B shows a plan view of a source electrode, a drain electrode, and metallic optical structures in FIG. 2D.
Figure 3A:
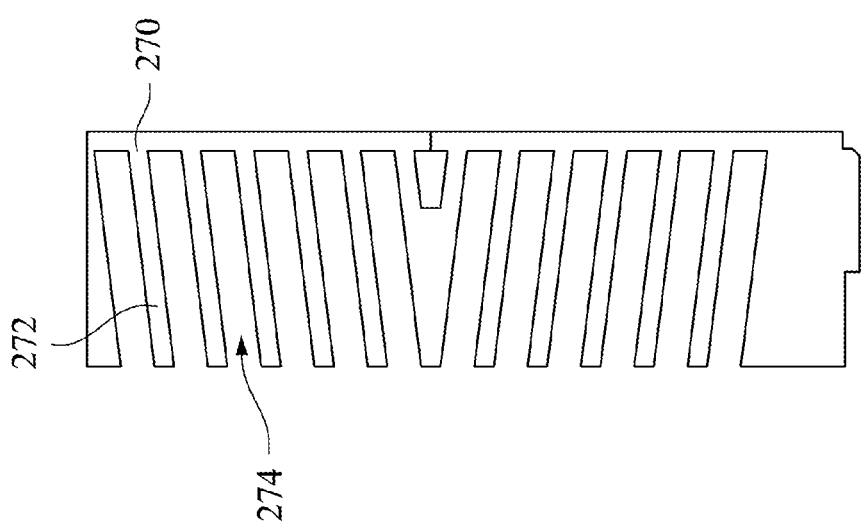
FIG. 3A shows a plan view of a pixel electrode in FIG. 2D.

FIG. 3A shows a plan view of the pixel electrode 270 in FIG. 2D. The pixel electrode 270 includes strip electrodes 272. A slit 274 is between the two adjacent strip electrodes 272. The pixel electrode 270, which is shown in FIG. 3A, is one type of slit electrodes without limits. The pixel electrode 270 may be a variety of slit electrodes having comb structures. Traditionally, slit electrodes can improve the color shift problem and expand viewing angles.

FIG. 3B shows a plan view of the source electrode 252, the drain electrode 254, and the metallic optical structures 256 in FIG. 2D. After overlapping FIGS. 3A and 3B, it can be seen that the metallic optical structures 256 and the strip electrodes 272 are arranged in parallel. More specifically, each metallic optical structure 256 overlaps one of the strip electrodes 272 and overlaps one of the slits 274. As mentioned in the background, when observing the liquid crystal display, black lines usually appear on strip electrodes and on the sift between two adjacent strip electrodes. Therefore, because light does not penetrate easily through the region which may appear black lines, the metallic optical structures 256 are disposed under the region, which may appear black lines, to reduce light shielding. Accordingly, the pixel structure 200 having the metallic optical structures 256 of the instant disclosure can used to solve the black lines problem in various displays and keep the advantages of the silt electrodes, such as low color shift, high contrast ratio, and wide viewing angle.

FIG. 3C shows a plan view of the gate insulating layer 230 in FIG. 2D. The gate insulating layer 230 has trenches 232, which may be filled with the metallic optical structures 256.

Figure 4:
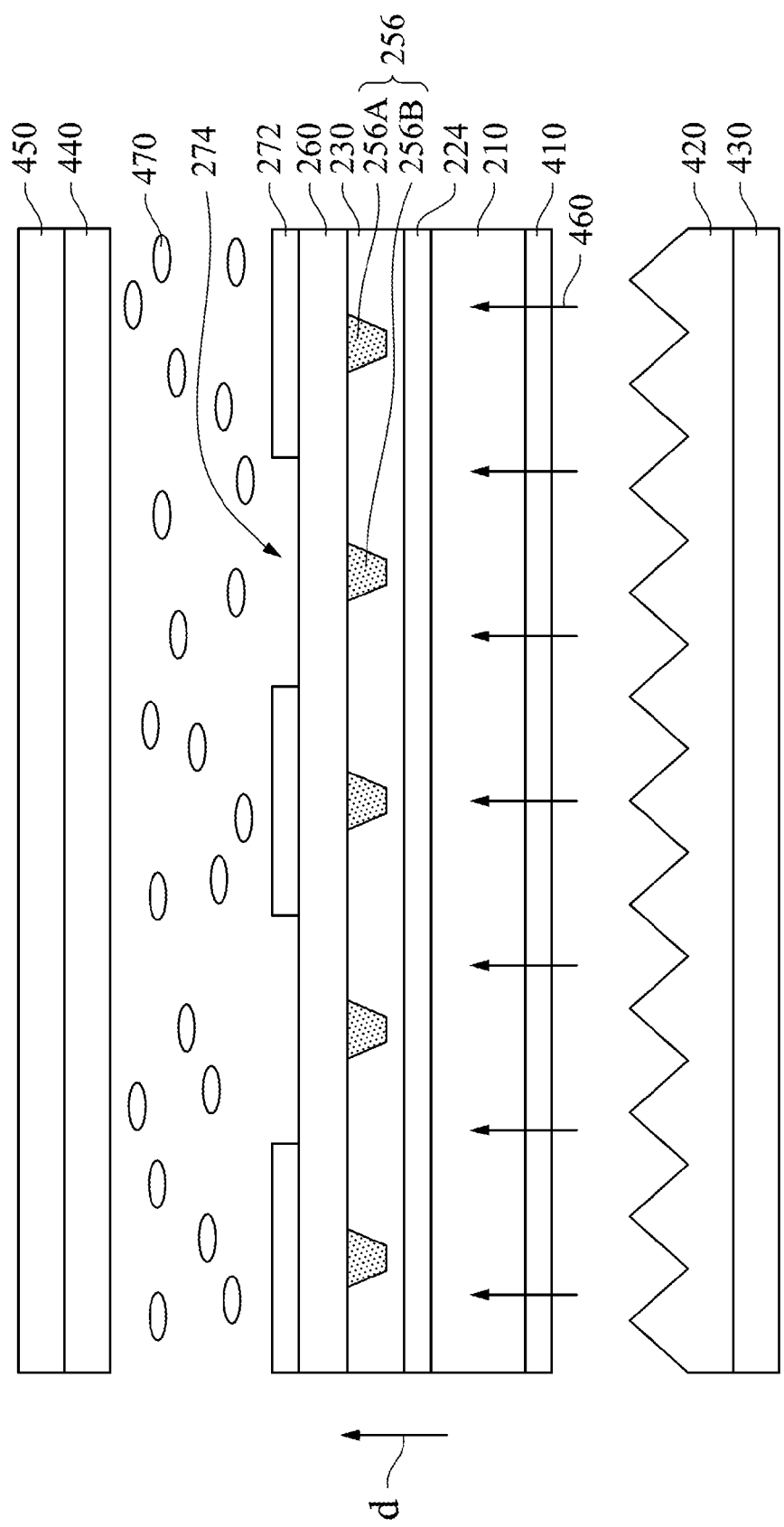
FIG. 4 is a partial cross-sectional view of a liquid crystal display, in accordance with one embodiment of the instant disclosure.

FIG. 4 is a partial cross-sectional view of a liquid crystal display, in accordance with one embodiment of the instant disclosure. The liquid crystal display includes the components of the pixel structure 200, a polarizer 410, a brightness enhancement film 420, a backlight source 430, a color layer 440, a cover plate 450, and liquid crystal molecules 470. For the sake of simplicity, the partial cross-sectional view of FIG. 4 only shows partial components of the pixel structure 200. The metallic optical structures 256 include a first metallic optical structure 256A and a second metallic optical structure 256B. The first metallic optical structure 256A overlaps one of the strip electrodes 272 in a direction d perpendicular to the substrate 210, and the second metallic optical structure 256B overlaps one of the slits 274 in the direction d perpendicular to the substrate 210. After light 460 is emitted from the backlight source 430 and then penetrates through the brightness enhancement film 420, the polarizer 410, the substrate 210, the common electrode 224, and the gate insulating layer 230, the light 460 is scattered by the metallic optical structures 256. The light reflected by the sidewalls of the metallic optical structures 256 may penetrate through the gaps between the metallic optical structures 256. The light reflected by the bottoms of the metallic optical structures 256 may achieve the brightness enhancement film 420. Subsequently, after the light is further reflected by the brightness enhancement film 420, the light 460 leaves again. Therefore, the backlight utilization efficiency is increased and the brightness of the liquid crystal display is enhanced. In one embodiment, widths of the strip electrodes 272 are larger than widths of the metallic optical structures 256. In one embodiment, the liquid crystal display is a fringe field switching liquid crystal display.

Figure 5:
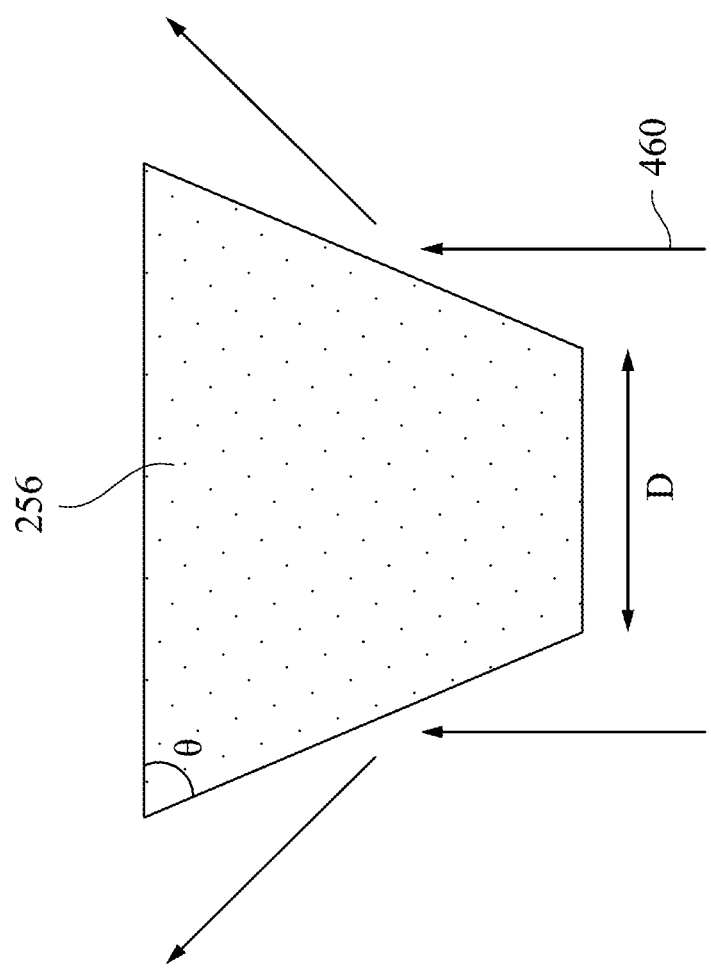
FIG. 5 is a cross-sectional view of a metallic optical structure, in accordance with one embodiment of the instant disclosure.

FIG. 5 is a cross-sectional view of the metallic optical structure 256, in accordance with one embodiment of the instant disclosure. A cross-section of the metallic optical structure 256 is in the shape of an inverted-trapezoid. In one embodiment, a bottom width D of the metallic optical structure 256 is 1-3 μm. In one embodiment, an angle θ is between the sidewall of the metallic optical structure 256 and the top surface of the metallic optical structure 256. The angle θ is 45-80 degrees.

Figure 6A:
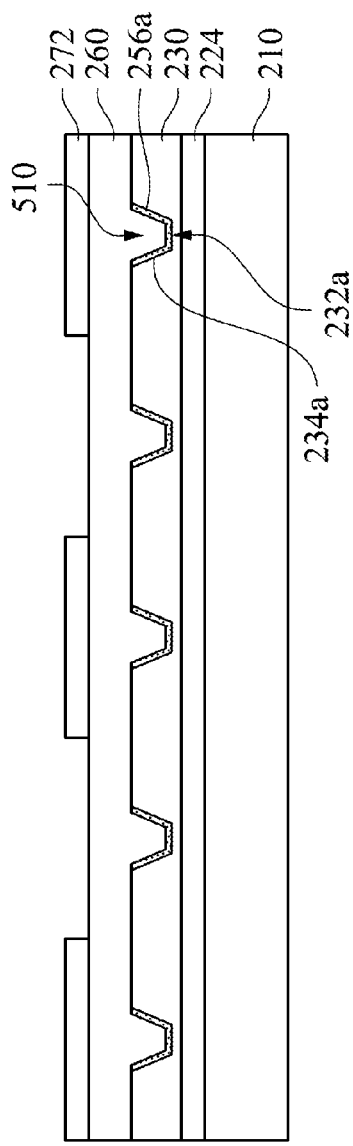
FIGS. 6A-6E are partial cross-sectional views of a pixel structure, in accordance with one embodiment of the instant disclosure.
Figure 6B:
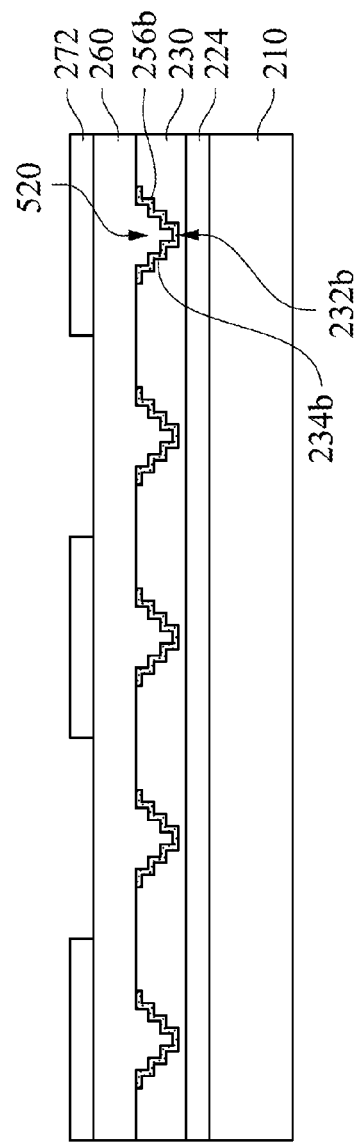
Figure 6C:
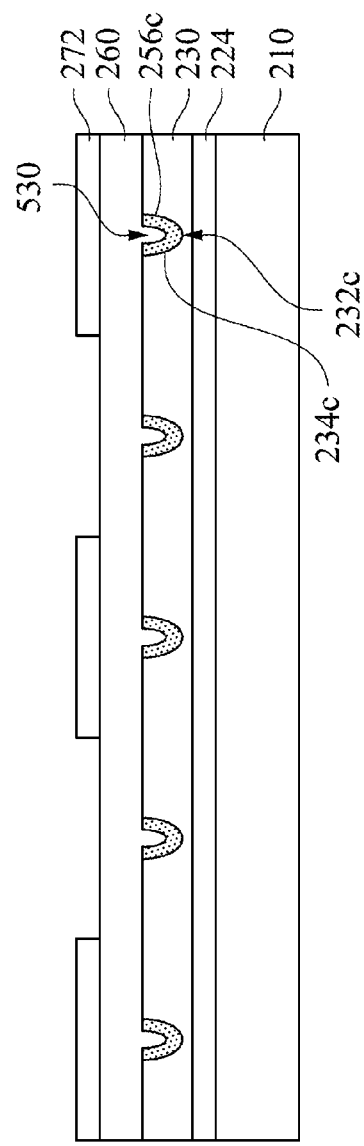

FIGS. 6A-6E are partial cross-sectional views of a pixel structure, in accordance with one embodiment of the instant disclosure. As shown in FIG. 6A, cross-sections of trenches 232a are in the shape of an inverted-trapezoid. Each metallic optical structure 256a covers an inner surface 234a of each trench 232a of the gate insulating layer 230 but does not fill each trench 232a to form a notch 510 on each metallic optical structure 256a. The notch 510 is filled with the protective layer 260. As shown in FIG. 6B, cross-sections of trenches 232b are in the shape of a step. Each metallic optical structure 256b covers an inner surface 234b of each trench 232b of the gate insulating layer 230 but does not fill each trench 232b to form a notch 520 on each metallic optical structure 256b. The notch 520 is filled with the protective layer 260. As shown in FIG. 6C, cross-sections of trenches 232c are in the shape of a semi-ellipse. Each metallic optical structure 256c covers an inner surface 234c of each trench 232c of the gate insulating layer 230 but does not fill each trench 232c to form a notch 530 on each metallic optical structure 256c. The notch 530 is filled with the protective layer 260.

Figure 6D:
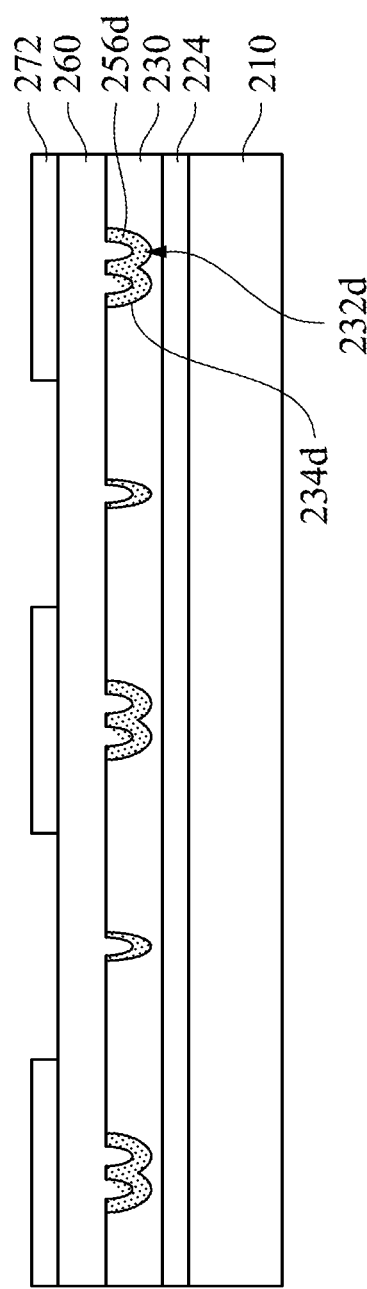
Figure 6E:
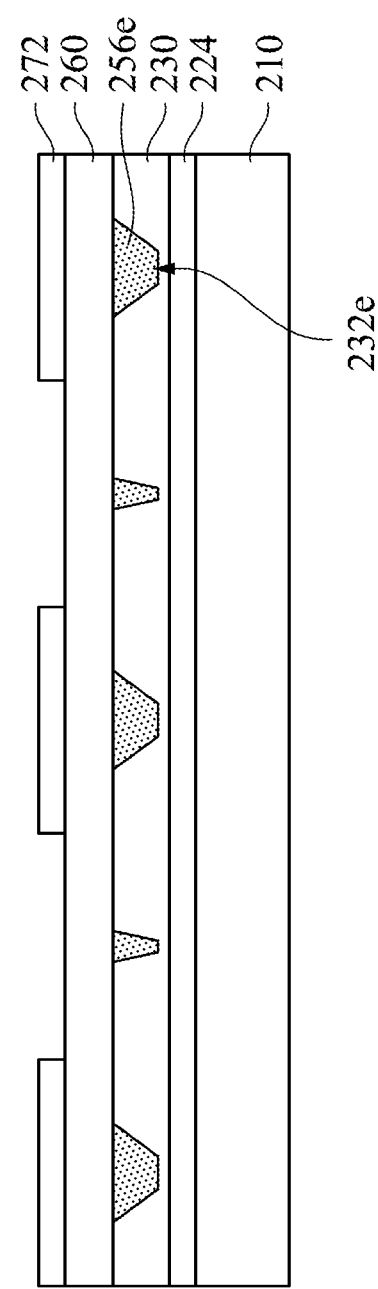

As shown in FIG. 6D, trenches 232d include unsized semi-elliptical trenches. Each metallic optical structure 256d covers an inner surface 234d of each trench 232d of the gate insulating layer 230. As shown in FIG. 6E, trenches 232e include unsized inverted-trapezoidal trenches. The metallic optical structures 256e fill the trenches 232e of the gate insulating layer 230. The shape of the metallic optical structure of the instant disclosure is determined by the shape of the trench. Therefore, the metallic optical structure can be designed to have various sizes and shapes, which are based on different design requirements, and metallic optical structures in different shapes and sizes can be embedded in the substrate at the same time. By using the method of forming the pixel structure of the instant disclosure, metallic optical structures can be designed flexibly to achieve the best result of reducing black lines and enhancing the brightness of the liquid crystal display.

Given above, the instant disclosure provides a pixel structure and a forming method thereof. The metallic optical structure is capable of scattering light achieving the pixel structure. Therefore, when the pixel structure is disposed in a liquid crystal display, the metallic optical structure can effectively increase backlight utilization efficiency, thereby enhancing brightness of the liquid crystal display. Moreover, the step of forming the metallic optical structure can be integrated into the existing fabrication techniques of forming pixel structure. The instant disclosure can enhance and optimize the brightness and the contrast ratio of the liquid crystal display by easily adjusting the structure of the metallic optical structure.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel structure, comprising:
a gate electrode disposed on a substrate;
a gate insulating layer on the gate electrode;
a source electrode and a drain electrode disposed on the gate insulating layer;
a plurality of metallic optical structures embedded in the gate insulating layer;
a pixel electrode electrically connecting the drain electrode and disposed on the plurality of metallic optical structures, wherein the pixel electrode comprises a plurality of strip electrodes, a slit is between the two adjacent strip electrodes, and the plurality of metallic optical structures and the plurality of strip electrodes are arranged in substantially parallel; and
a common electrode disposed under the plurality of metallic optical structures.

2. The pixel structure of claim 1, wherein the gate insulating layer has a plurality of trenches and each metallic optical structure is disposed in one of the plurality of trenches.

3. The pixel structure of claim 2, wherein the plurality of metallic optical structures fill the plurality of trenches of the gate insulating layer.

4. The pixel structure of claim 2, wherein each metallic optical structure covers an inner surface of each trench of the gate insulating layer but does not fill each trench to form a notch on each metallic optical structure.

5. The pixel structure of claim 2, wherein cross-sections of the plurality of trenches are in the shape of an inverted trapezoid, a step, a semi-ellipse, or a combination thereof.

6. The pixel structure of claim 1, wherein a material of the source electrode and a material of the drain electrode are the same as a material of the plurality of metallic optical structures.

7. The pixel structure of claim 1, wherein the plurality of metallic optical structures comprise at least one first metallic optical structure and at least one second metallic optical structure, the first metallic optical structure overlaps one of the plurality of strip electrodes in a direction perpendicular to the substrate, and the second metallic optical structure overlaps one of the slits in the direction perpendicular to the substrate.

8. The pixel structure of claim 1, further comprising an active layer on the gate insulating layer and below the source electrode and the drain electrode.

9. A method of forming a pixel structure, comprising:
forming a gate electrode and a common electrode on a substrate;
forming a gate insulating layer on the gate electrode;
patterning the gate insulating layer to form a plurality of trenches;
forming a source electrode, a drain electrode, and a plurality of metallic optical structures, wherein each metallic optical structure is disposed in one of the plurality trenches, and the source electrode and the drain electrode are on the gate insulating layer; and
forming a pixel electrode on the plurality of metallic optical structures, wherein the pixel electrode comprises a plurality of strip electrodes, a slit is between the two adjacent strip electrodes, and the plurality of metallic optical structures and the plurality of strip electrodes are arranged in substantially parallel.

10. The method of claim 9, wherein patterning the gate insulating layer is performed by a gray scale mask.

11. The method of claim 9, further comprising forming an active layer on the gate insulating layer, before forming the source electrode, the drain electrode, and the plurality of metallic optical structures.

* * * * *